(12) United States Patent
Lu et al.

(10) Patent No.: US 10,345,645 B2
(45) Date of Patent: Jul. 9, 2019

(54) DISPLAY DEVICE

(71) Applicants: Boe Technology Group Co., Ltd., Beijing (CN); Beijing Boe Optoelectronics Technology Co., Ltd., Beijing (CN)

(72) Inventors: Pengcheng Lu, Beijing (CN); Xue Dong, Beijing (CN); Xiaochuan Chen, Beijing (CN); Wenqing Zhao, Beijing (CN); Jian Gao, Beijing (CN); Qian Wang, Beijing (CN); Ming Yang, Beijing (CN); Lei Wang, Beijing (CN); Rui Xu, Beijing (CN); Xiaochen Niu, Beijing (CN); Haisheng Wang, Beijing (CN)

(73) Assignees: BOE TECHNOLOGY GROUP CO., LTD., Beijing (CN); BEIJIN BOE OPTOELECTRONICS TECHNOLOGY CO., LTD., Beijing (CN)

( * ) Notice: Subject to any disclaimer, the term of this patent is extended or adjusted under 35 U.S.C. 154(b) by 60 days.

(21) Appl. No.: 15/525,859

(22) PCT Filed: Sep. 9, 2016

(86) PCT No.: PCT/CN2016/098496
§ 371 (c)(1),
(2) Date: May 10, 2017

(87) PCT Pub. No.: WO2017/118072
PCT Pub. Date: Jul. 13, 2017

(65) Prior Publication Data
US 2018/0074374 A1    Mar. 15, 2018

(30) Foreign Application Priority Data

Jan. 8, 2016 (CN) .......................... 2016 1 0012184

(51) Int. Cl.
*G02B 27/00* (2006.01)
*G02F 1/133* (2006.01)
(Continued)

(52) U.S. Cl.
CPC ... *G02F 1/133606* (2013.01); *G02B 27/0093* (2013.01); *G02B 27/1006* (2013.01);
(Continued)

(58) Field of Classification Search
CPC .......... G02F 1/133606; G02B 27/0093; G02B 27/1006
See application file for complete search history.

(56) References Cited

U.S. PATENT DOCUMENTS

| 2005/0057702 A1 | 3/2005 | Cho et al. |
| 2006/0109399 A1* | 5/2006 | Kubota ................ G02B 5/3041 349/96 |

(Continued)

FOREIGN PATENT DOCUMENTS

| CN | 1576953 A | 2/2005 |
| CN | 102681185 A | 9/2012 |

(Continued)

OTHER PUBLICATIONS

International Search Report and Written Opinion in PCT/CN2016/098496 dated Nov. 29, 2016, with English translation.
(Continued)

*Primary Examiner* — Lucy P Chien
(74) *Attorney, Agent, or Firm* — Womble Bond Dickinson (US) LLP (57) ABSTRACT

An embodiment of the present disclosure discloses a display device which uses a black and white liquid crystal display panel, i.e., not arranging a color resistor layer formed by the color resistor material in the liquid crystal display panel, and arranging a light splitting film between a backlight panel and
(Continued)

a liquid crystal layer. The light splitting film enables light emitted from the backlight panel to be split into light of N colors, and light of each color is projected onto a corresponding sub-pixel of the liquid crystal display panel.

17 Claims, 4 Drawing Sheets

(51) Int. Cl.
*G06F 3/01* (2006.01)
*G02B 27/10* (2006.01)
*G02B 27/22* (2018.01)
*H01L 27/32* (2006.01)
*G02F 1/1335* (2006.01)

(52) U.S. Cl.
CPC ..... *G02B 27/1086* (2013.01); *G02B 27/2214* (2013.01); *G02F 1/13306* (2013.01); *G02F 1/13362* (2013.01); *G02F 1/133528* (2013.01); *G02F 1/133603* (2013.01); *G02F 1/133621* (2013.01); *G06F 3/013* (2013.01); *H01L 27/3272* (2013.01); *G02B 27/225* (2013.01); *G02F 2001/133607* (2013.01); *G02F 2201/44* (2013.01); *H01L 27/3232* (2013.01)

(56) References Cited

U.S. PATENT DOCUMENTS

| | | | | |
|---|---|---|---|---|
| 2007/0040950 | A1* | 2/2007 | Jung | G02B 6/0053 349/5 |
| 2010/0118045 | A1* | 5/2010 | Brown Elliott | G02B 27/2214 345/589 |
| 2013/0286168 | A1* | 10/2013 | Park | G09G 3/003 348/54 |
| 2013/0321246 | A1 | 12/2013 | Li et al. | |
| 2017/0084213 | A1 | 3/2017 | Yang et al. | |

FOREIGN PATENT DOCUMENTS

| | | |
|---|---|---|
| CN | 103278958 A | 9/2013 |
| CN | 103487983 A | 1/2014 |
| CN | 104297931 A | 1/2015 |
| CN | 105093553 A | 11/2015 |
| JP | H 1042316 A | 2/1998 |

OTHER PUBLICATIONS

"First office action," CN Application No. 201610012184.2 (Apr. 22, 2019).

* cited by examiner

DISPLAY DEVICE

RELATED APPLICATIONS

The present application is the U.S. national phase entry of PCT/CN2016/098496, with an international filing date of Sep. 9, 2016, which claims the benefit of Chinese Patent Application No. 201610012184.2, filed Jan. 8, 2016, the entire disclosures of which are incorporated herein by reference.

TECHNICAL FIELD

The present disclosure relates to the field of display technology, particularly to a display device.

BACKGROUND DISCLOSURE

With continuous development of display technology, flat display panels such as an organic light emitting diode (OLED) display panel, a liquid crystal display (LCD), a light emitting diode (LED) display panel and a plasma display panel (PDP) have developed rapidly.

Taking the existing LCD as an example, the LCD mainly consists of an array substrate, a color film substrate and liquid crystal molecules located between the two substrates. Specifically, a gate line, a data line, a thin film transistor (TFT) and a pixel electrode are arranged on the array substrate. A black matrix, a color resistor layer and a common electrode are arranged on the color film substrate. When the gate line inputs a scanning signal of a high potential, the TFT connected with the gate line is in a turn-on state. A gray scale signal loaded by the data line is applied to the pixel electrode through the TFT, thereby enabling the electric field formed between the pixel electrode and the common electrode to control deflection of the liquid crystal molecules. The liquid crystal molecules modulate the light emitted from the backlight source that passes through them, so as to enable it to be irradiated onto the color resistor layer of the color film substrate with different light intensities. The color resistor layer splits the white light into three primary colors of red, green and blue using a color filter principle so as to realize color display. Because light transmissivity of the color resistor material of the color resistor layer is relatively low, it results in a relatively large light loss of the LCD and a relatively low light transmissivity.

SUMMARY

Therefore, it is desired to provide a display device which reduces light loss to improve light transmissivity.

According to an aspect, an embodiment of the present disclosure provides a display device, comprising: a backlight panel that emits white light, a black and white liquid crystal display panel located at a light exit side of the backlight panel, and a light splitting film located between the liquid crystal layer and the backlight panel. The liquid crystal display panel comprises a first substrate and a second substrate arranged opposite to each other and a liquid crystal layer located between the first substrate and the second substrate. The liquid crystal display panel has a plurality of pixels arranged in matrix, each pixel comprising N sub-pixels arranged in a row direction, N being an integer greater than or equal to 3. The light emitted from the backlight panel is split into light of N colors after passing through the light splitting film, and light of each color is projected onto a corresponding sub-pixel of the liquid crystal display panel.

According to an embodiment of the present disclosure, the backlight panel can be an organic electroluminescent display panel. The organic electroluminescent display panel has a plurality of light emitting pixels arranged in matrix, and an area corresponding to at least one column of adjacent light emitting pixels is a column area. Light emitting column areas and light shielding column areas in the organic electroluminescent display panel are arranged alternately. And when performing display, light emitting pixels in the light emitting column areas emit light, and light emitting pixels in the light shielding column areas do not emit light. In the liquid crystal display panel, an area corresponding to at least one column of pixels is a monocular pixel area, and left eye pixel areas and right eye pixel areas are arranged alternately. When performing 2D display, pixels corresponding to the left eye pixel areas and pixels corresponding to the adjacent right eye pixel areas display same image information. And when performing 3D display, the pixels corresponding to the left eye pixel areas display left eye image information, and the pixels corresponding to the right eye pixel areas display right eye image information. The light emitted by the light emitting column areas in the organic electroluminescent display panel is projected towards a direction corresponding to a human left eye via the left eye pixel areas in the liquid crystal display panel, and projected towards a direction corresponding to a human right eye via the right eye pixel areas in the liquid crystal display panel.

According to an embodiment of the present disclosure, the display device can further comprise: a human eye tracking control module. The human eye tracking control module is configured to control the monocular pixel area of the liquid crystal display panel to shift along a row direction based on a shift distance of a target human eye to the left or to the right, or control the column area of the organic electroluminescent display panel to shift along the row direction.

According to an embodiment of the present disclosure, the human eye tracking control module can comprise: a human eye tracking unit, configured to determine a calculation shift distance $\Delta S$ of the monocular pixel area in the liquid crystal display panel based on the shift distance $\Delta P$ of the target human eye to the left or to the right according to $$\frac{\Delta S}{\Delta P} = \frac{H}{L},$$

wherein L is a distance between the target human eye and the organic electroluminescent display panel, H is a distance between the liquid crystal layer of the liquid crystal display panel and the organic electroluminescent display panel; and a control unit, configured to control the monocular pixel area of the liquid crystal display panel to shift for a distance of integer sub-pixels along a row direction consistent with the human eye moving direction based on the determined calculation shift distance $\Delta S$.

According to an embodiment of the present disclosure, the control unit is further configured to: calculate a shift multiple m based on the determined calculation shift distance $\Delta S$ according to $$m = \frac{\Delta S}{\Delta X},$$

wherein ΔX is a width of one column of sub-pixels in the liquid crystal display panel, control the monocular pixel area of the liquid crystal display panel to shift for a distance of m sub-pixels along the row direction if the shift multiple m is an integer, round off the shift multiple m to obtain m' if the shift multiple m is not an integer, and control the monocular pixel area of the liquid crystal display panel to shift for a distance of m' sub-pixels along the row direction.

According to an embodiment of the present disclosure, the human eye tracking control module can comprise: a human eye tracking unit, configured to determine a calculation shift distance ΔS' of the column area in the organic electroluminescent display panel based on the shift distance ΔP of the target human eye to the left or to the right according to $$\frac{\Delta S'}{\Delta P} = \frac{H}{L-H},$$

wherein L is a distance between the target human eye and the organic electroluminescent display panel, H is a distance between the liquid crystal layer of the liquid crystal display panel and the organic electroluminescent display panel; and a control unit, configured to control the column area of the organic electroluminescent display panel to shift for a distance of integer light emitting pixels along a row direction opposite to the human eye moving direction based on the determined calculation shift distance ΔS'.

According to an embodiment of the present disclosure, the control unit is further configured to: calculate a shift multiple m based on the determined calculation shift distance ΔS' according to $$m = \frac{\Delta S'}{\Delta X'},$$

wherein ΔX' is a width of one column of light emitting pixels in the organic electroluminescent display panel; control the column area of the organic electroluminescent display panel to shift for a distance of m light emitting pixels along the row direction if the shift multiple m is an integer; round off the shift multiple m to obtain m' if the shift multiple m is not an integer, and control the column area of the organic electroluminescent display panel to shift for a distance of m' light emitting pixels along the row direction.

According to an embodiment of the present disclosure, the light splitting film can be located at a side of the backlight panel facing towards the liquid crystal display panel.

According to an embodiment of the present disclosure, the first substrate is closer to the backlight panel than the second substrate, and the light splitting film is located at a side of the first substrate facing towards the liquid crystal layer.

According to an embodiment of the present disclosure, the first substrate is closer to the backlight panel than the second substrate, and the light splitting film is located at a side of the first substrate facing towards the backlight panel.

According to an embodiment of the present disclosure, the first substrate is closer to the backlight panel than the second substrate, and a polarizer is further arranged at a side of the first substrate facing away from the liquid crystal layer. The light splitting film is located at a side of the polarizer facing towards the backlight panel, or the light splitting film is located between the first substrate and the polarizer.

DETAILED DESCRIPTION OF THE DISCLOSURE

In order to enable objects, technical solutions and advantages of the present disclosure to be clearer, next, embodiments of the present disclosure will be described in detail further with reference to the drawings. Apparently, the embodiments described herein are only a part of rather than all of embodiments of the present disclosure. Based on embodiments in the present disclosure, all other embodiments obtained by the ordinary skilled person in the art without any creative work should belong to the protection scope of the present disclosure.

Shapes and sizes of components in the drawings do not reflect the real proportion of the display device, which only aim to explaining embodiments of the present disclosure schematically.

An embodiment of the present disclosure provides a display device. As shown in FIG. 1a to FIG. 1d, the display device comprises: a backlight panel 1 that emits white light, a black and white liquid crystal display panel 2 located at a light exit side of the backlight panel 1, and a light splitting film 3 located between a liquid crystal layer 23 and the backlight panel 1. The liquid crystal display panel 2 comprises a first substrate 21 and a second substrate 22 arranged opposite to each other and the liquid crystal layer 23 located between the first substrate 21 and the second substrate 22. The liquid crystal display panel 2 has a plurality of pixels arranged in matrix, each pixel comprising N sub-pixels arranged in a row direction. N is an integer greater than or equal to 3. The light emitted from the backlight panel 1 is split into light of N colors after passing through the light splitting film 3, and light of each color is projected onto a corresponding sub-pixel of the liquid crystal display panel 2.

It should be noted that, in the above display device provided by the embodiment of the present disclosure, the black and white liquid crystal display panel refers to a liquid crystal display panel in which a color resistor layer formed by a color resistor material is not arranged.

The display device provided by the embodiment of the present disclosure uses a black and white liquid crystal display panel, i.e., not arranging a color resistor layer formed by a color resistor material in the liquid crystal display panel, and arranging a light splitting film between the backlight panel and the liquid crystal layer. The light splitting film enables the light emitted from the backlight panel to be split into light of N colors, and the light of each color is projected onto a corresponding sub-pixel of the liquid crystal display panel. In this way, the light splitting film is used to replace the color resistor layer in the existing liquid crystal display device, and split the white light of the backlight panel into light of different colors so as to realize color display. Because light splitting efficiency of the light splitting film can be more than 30% generally, while light splitting efficiency of the color resistor layer is generally about 10%, hence, use of the light splitting film can reduce light loss of the display device and improve light transmissivity of the display device, thereby reducing power consumption of the display device.

The first substrate can be an array substrate, and the second substrate can be a counter substrate. Certainly, the first substrate can also be a counter substrate, and the second substrate can be an array substrate, which will not be defined here.

According to an embodiment, N can be equal to 3. The light of three colors can be red light, green light and blue light respectively.

Figure 2:
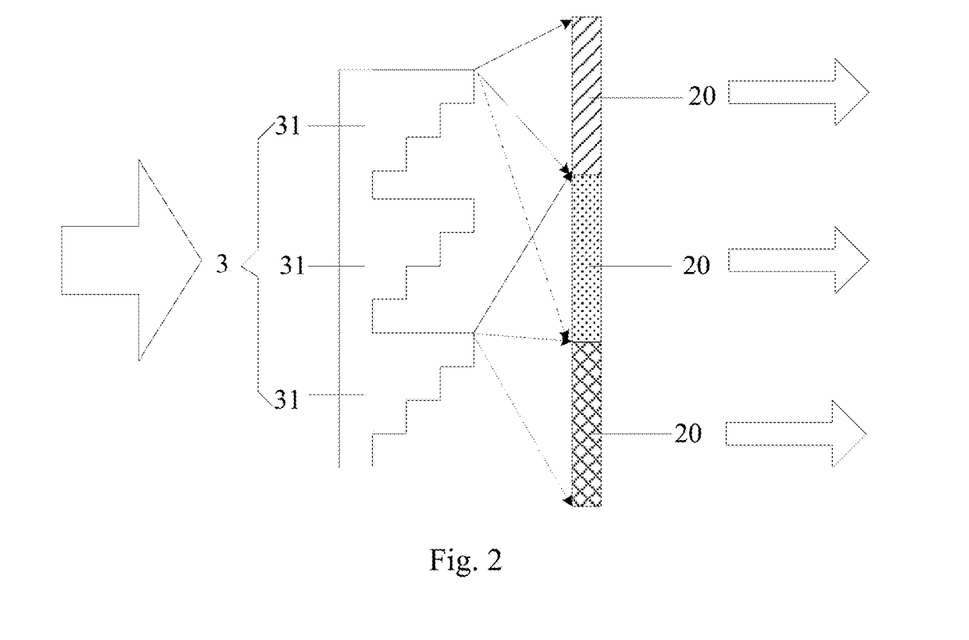
FIG. 2 is a schematic view of light splitting principle of a light splitting film provided by an embodiment of the present disclosure.

In specific implementation, as shown in FIG. 2, the light splitting film 3 can comprise light splitting microstructures 31 in periodic distribution. The light splitting microstructure 31 for example can be a step structure. When the white light passes through the light splitting microstructure 31, refraction angles of light of different wavelengths in the white light after passing through the light splitting microstructure 31 are different. Hence, the white light will be split into light of different colors. The light of each color is projected onto a corresponding sub-pixel 20 in the liquid crystal display panel 2, so as to realize color display. Since the structure and principle of the light splitting film are both same as the structure and principle of the existing light splitting film, it will not be elaborated here.

According to an embodiment of the present disclosure, as shown in FIG. 1a to FIG. 1d, the first substrate 21 is closer to the backlight panel 1 than the second substrate 22.

As shown in FIG. 1a to FIG. 1d, polarizers 24 can be further arranged at a side of the first substrate 21 facing away from the liquid crystal layer 23 and at a side of the second substrate 22 facing away from the liquid crystal display layer 23.

Figure 1A:
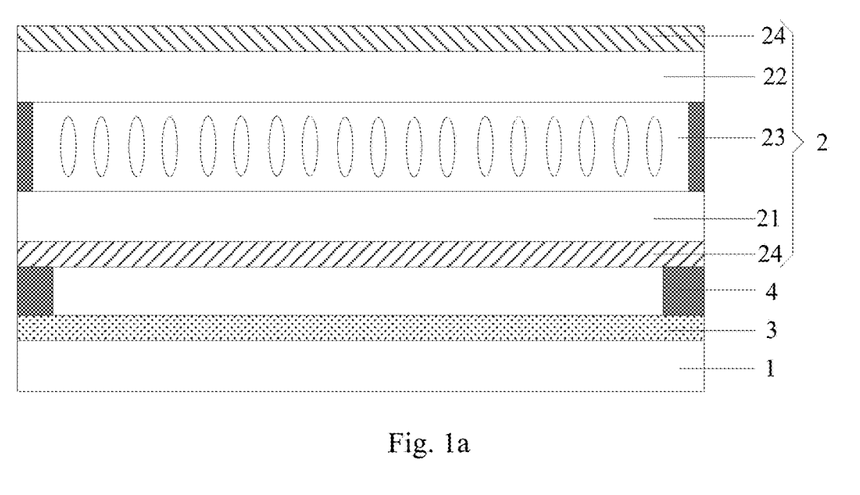
FIG. 1a to FIG. 1d are structural schematic views of a display device provided by an embodiment of the present disclosure respectively.

As shown in FIG. 1a, the light splitting film 3 can be located at a side of the backlight panel 1 facing towards the liquid crystal display panel 2.

Figure 1B:
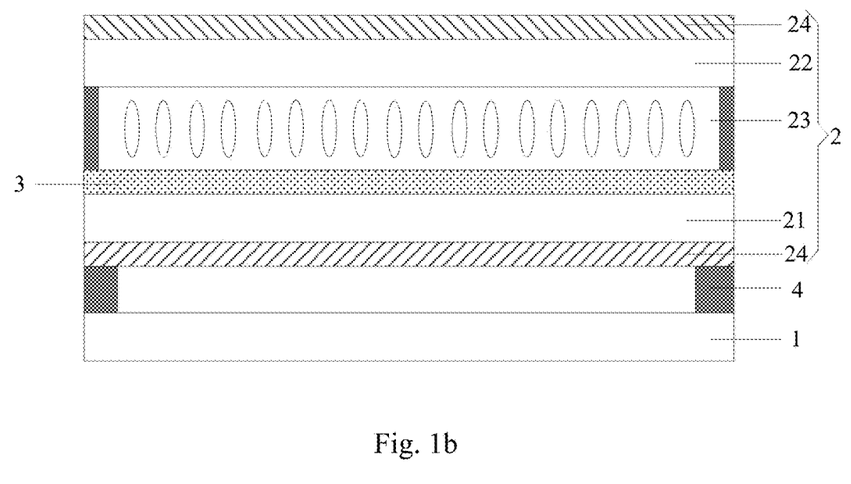

Or, as shown in FIG. 1b, the light splitting film 3 can be located at a side of the first substrate 21 facing towards the liquid crystal layer 23.

Figure 1C:
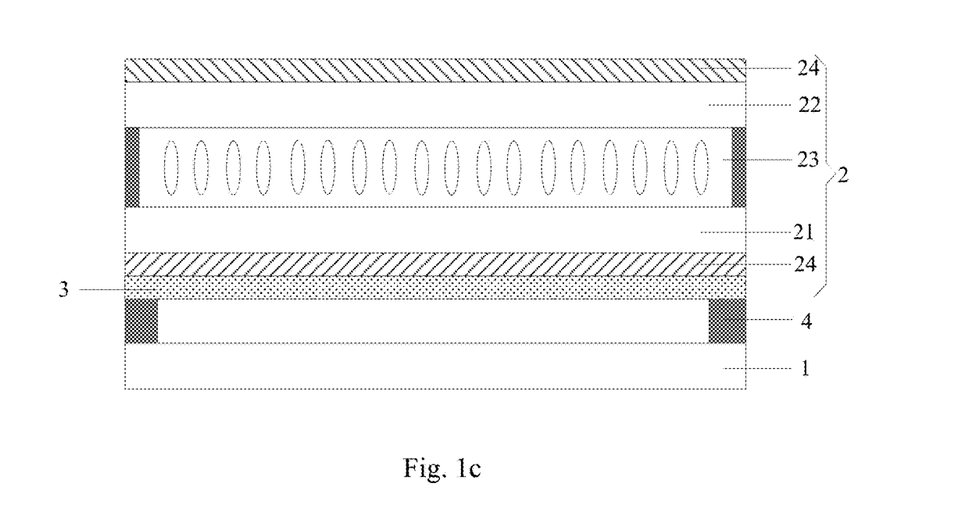
Figure 1D:
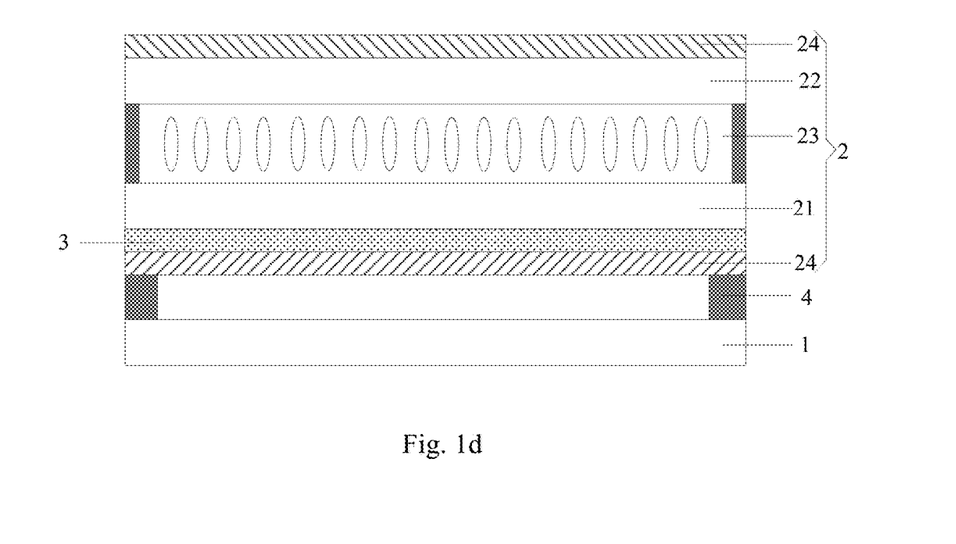

Or, as shown in FIG. 1c and FIG. 1d, the light splitting film 3 can be located at a side of the first substrate 21 facing towards the backlight panel 1.

In the event that a polarizer 24 is further arranged at a side of the first substrate 21 facing away from the liquid crystal layer 23, as shown in FIG. 1c, the light splitting film 3 can be located at a side of the polarizer 24 facing towards the backlight panel 1. Or, as shown in FIG. 1d, the light splitting film 3 can also be located between the first substrate 21 and the polarizer 24.

As shown in FIG. 1a to FIG. 1d, the liquid crystal display panel 2 and the backlight panel 1 for example can be fixed through a seal agent 4.

Figure 3:
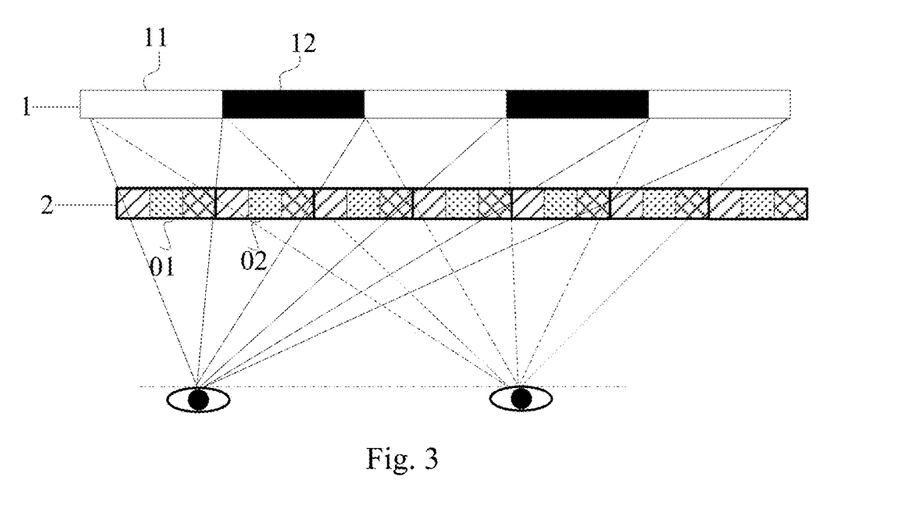
FIG. 3 is a schematic view of principle for a display device provided by an embodiment of the present disclosure performing 3D display.

According to an embodiment of the present disclosure, as shown in FIG. 3, the backlight panel 1 can be an organic electroluminescent display panel. The organic electroluminescent display panel has a plurality of light emitting pixels arranged in matrix. An area corresponding to at least one column of adjacent light emitting pixels is a column area (as shown by reference signs 11 and 12 in FIG. 3). Light emitting column areas 11 and light shielding column areas 12 in the organic electroluminescent display panel are arranged alternately. When performing display, light emitting pixels in the light emitting column areas 11 emit light, and light emitting pixels in the light shielding column areas 12 do not emit light.

In the liquid crystal display panel 2, an area corresponding to at least one column of pixels is a monocular pixel area (as shown by reference signs 01 and 02 in FIG. 3). And left eye pixel areas and right eye pixel areas are arranged alternately. When performing 2D display, pixels corresponding to the left eye pixel areas 01 and pixels corresponding to the adjacent right eye pixel areas 02 display same image information. When performing 3D display, the pixels corresponding to the left eye pixel areas 01 display left eye image information, and the pixels corresponding to the right eye pixel areas 02 display right eye image information.

The light emitted by the light emitting column areas 11 in the organic electroluminescent display panel is projected towards a direction corresponding to a human left eye via the left eye pixel areas 01 in the liquid crystal display panel, and projected towards a direction corresponding to a human right eye via the right eye pixel areas 02 in the liquid crystal display panel.

In specific implementation, the distance between the liquid crystal display panel and the organic electroluminescent display panel can be adjusted so as to enable the light emitted by the light emitting column areas in the organic electroluminescent display panel to be projected towards a direction corresponding to a human left eye via the left eye pixel areas in the liquid crystal display panel, and projected towards a direction corresponding to a human right eye via the right eye pixel areas in the liquid crystal display panel. The specific principle is the same as that of the existing 3D display device, which will not be elaborated here.

In an display device provided by an embodiment of the present disclosure, the organic electroluminescent display panel controls brightness of display, the light splitting film controls chroma of display, and the liquid crystal display panel controls light exit degree of the light from the organic electroluminescent display panel after passing through the light splitting film and the liquid crystal layer by controlling rotation of the liquid crystal molecules in the liquid crystal layer, i.e., the liquid crystal display panel controls gray scale of display. By controlling the light emitting column areas of the organic electroluminescent display panel and controlling display content of the liquid crystal display panel, switching between 2D display and 3D display can be realized. However, in the above display device, when performing 3D display, a better 3D effect can only be seen at a fixed position. As long as the human eye moves, a crosstalk phenomenon will occur, which reduces a 3D effect, even without the 3D effect.

Therefore, according to another embodiment of the present disclosure, in order to mitigate or avoid a 3D crosstalk problem caused by movement of the human eyes, the display device can further comprise a human eye tracking control module. The human eye tracking control module is configured to control the monocular pixel area of the liquid crystal display panel to shift along a row direction based on a shift distance of a target human eye to the left or to the right, or control the column area of the organic electroluminescent display panel to shift along the row direction.

Next, explanations will be made through two specific embodiments respectively.

According to an embodiment, the human eye tracking control module is configured to control the monocular pixel area of the liquid crystal display panel to shift along a row direction based on a shift distance of a target human eye to the left or to the right.

Specifically, the human eye tracking control module can comprise:

a human eye tracking unit, configured to determine a calculation shift distance ΔS of the monocular pixel area in the liquid crystal display panel based on the shift distance ΔP of the target human eye to the left or to the right according to $$\frac{\Delta S}{\Delta P} = \frac{H}{L},$$

wherein L is a distance between the target human eye and the organic electroluminescent display panel, H is a distance between the liquid crystal layer of the liquid crystal display panel and the organic electroluminescent display panel; and a control unit, configured to control the monocular pixel area of the liquid crystal display panel to shift for a distance of integer sub-pixels along a row direction consistent with the human eye moving direction based on the determined calculation shift distance ΔS. That is, when the human eyes shift to the left, the monocular pixel area of the liquid crystal display panel shifts to the left along the row direction, and when the human eyes shift to the right, the monocular pixel area of the liquid crystal display panel shift to the right along the row direction.

The control unit can be further configured to: calculate a shift multiple m based on the determined calculation shift distance ΔS according to $$m = \frac{\Delta S}{\Delta X},$$

ΔX being a width of one column of sub-pixels in the liquid crystal display panel;

control the monocular pixel area of the liquid crystal display panel to shift for a distance of m sub-pixels along the row direction if the shift multiple m is an integer;

round off the shift multiple m to obtain m' if the shift multiple m is not an integer, and control the monocular pixel area of the liquid crystal display panel to shift for a distance of m' sub-pixels along the row direction.

Figure 4:
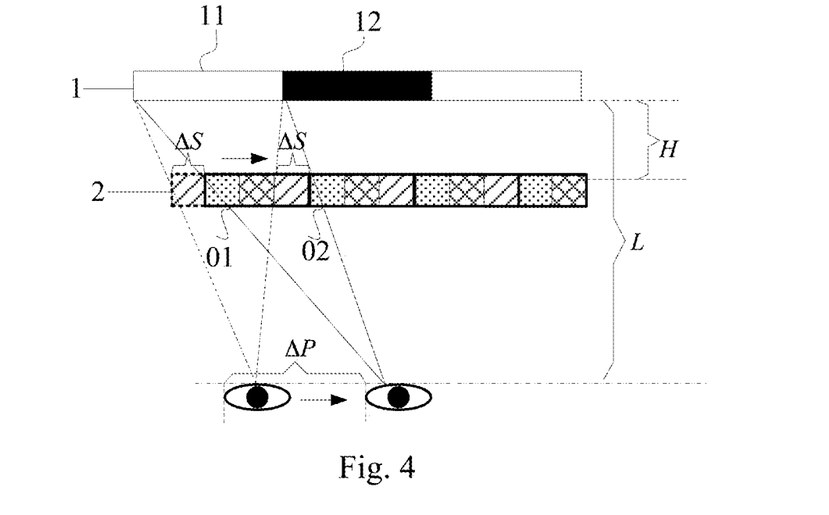
FIG. 4 is a schematic view of principle of controlling movements of monocular pixel areas in a liquid crystal display panel for a display device provided by an embodiment of the present disclosure performing 3D display.

Take the example that the target human eyes shift to the right for explanation. As shown in FIG. 4, when the target human eyes shift to the right for a distance ΔP, the shift distance ΔP of the human eyes to the right and the calculation shift distance ΔS of the monocular pixel areas (01 and 02) meet the formula $$\frac{\Delta S}{\Delta P} = \frac{H}{L}.$$

Thus, the calculation shift distance ΔS of the monocular pixel areas (01 and 02) can be calculated. Since each monocular pixel area (01 and 02) in the liquid crystal display panel is an area corresponding to at least one column of pixels, when the monocular pixel areas (01 and 02) in the liquid crystal display panel are controlled to shift, they can only shift by taking the sub-pixel as the minimum unit. Hence, when the calculation shift distance ΔS is equal to an integral multiple of the width ΔX of one column of sub-pixels in the liquid crystal display panel, i.e., when the shift multiple m in $$m = \frac{\Delta S}{\Delta X}$$

is an integer, the monocular pixel areas (01 and 02) in the liquid crystal display panel are controlled to shift for a distance of m sub-pixels to the right along the row direction, i.e., shifting for ΔS. However, when the shift multiple m is not an integer, the shift distance of the monocular pixel areas (01 and 02) should be enabled to not only meet the integral multiple of the width of the sub-pixel but also be closest to the calculated calculation shift distance ΔS. Hence, the shift multiple m is firstly rounded off to obtain m', and then the monocular pixel area of the liquid crystal display panel is controlled to shift for a distance of m' sub-pixels to the right along the row direction. For example, in FIG. 4, the monocular pixel areas (01 and 02) of the liquid crystal display panel shifts for a width of one sub-pixel to the right.

According to another embodiment, the human eye tracking control module is configured to control the column area of the organic electroluminescent display panel to shift along the row direction based on a shift distance of a target human eye to the left or to the right.

For example, the human eye tracking control module can comprise:

a human eye tracking unit, configured to determine a calculation shift distance ΔS' of the column area in the organic electroluminescent display panel based on the shift distance ΔP of the target human eye to the left or to the right according to $$\frac{\Delta S'}{\Delta P} = \frac{H}{L - H},$$

wherein L is a distance between the target human eye and the organic electroluminescent display panel, H is a distance between the liquid crystal layer of the liquid crystal display panel and the organic electroluminescent display panel; and a control unit, configured to control the column area of the organic electroluminescent display panel to shift for a distance of integer light emitting pixels along a row direction opposite to the human eye moving direction based on the determined calculation shift distance ΔS'. That is, when the human eyes shift to the left, the column areas of the organic electroluminescent display panel shift to the right along the row direction, and when the human eyes shift to the right, the column areas of the organic electroluminescent display panel shift to the left along the row direction.

The control unit is further configured to: calculate a shift multiple m based on the determined calculation shift distance ΔS' according to $$m = \frac{\Delta S'}{\Delta X'},$$

wherein ΔX' is a width of one column of light emitting pixels in the organic electroluminescent display panel;

control the column area of the organic electroluminescent display panel to shift for a distance of m light emitting pixels along the row direction if the shift multiple m is an integer;

round off the shift multiple m to obtain m' if the shift multiple m is not an integer, and control the column area of the organic electroluminescent display panel to shift for a distance of m' light emitting pixels along the row direction.

Figure 5:
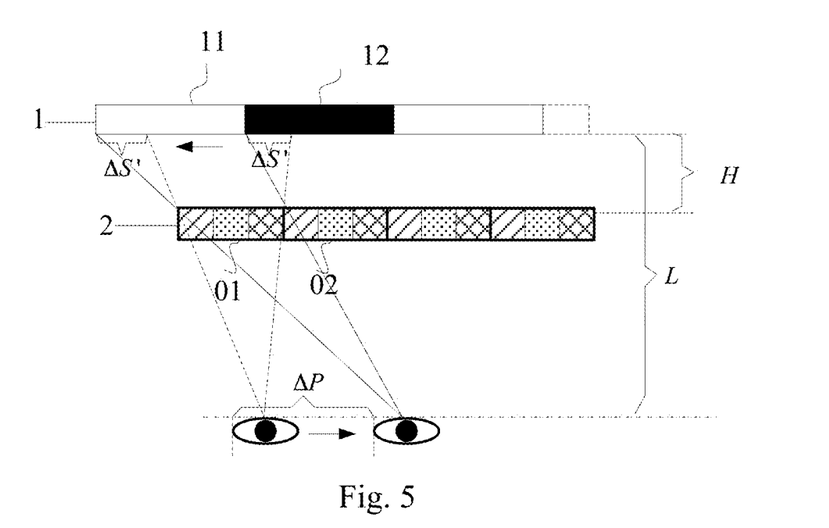
FIG. 5 is a schematic view of principle of controlling movements of column areas in an organic electroluminescent display panel for a display device provided by an embodiment of the present disclosure performing 3D display.

Take the example that the target human eyes shift to the right for explanation. As shown in FIG. 5, when the target human eyes shift to the right for a distance ΔP, the shift distance ΔP of the human eyes to the right and the calculation shift distance ΔS' of the column areas (11 and 12) meet the formula $$\frac{\Delta S'}{\Delta P} = \frac{H}{L-H}.$$

Thus, the calculation shift distance ΔS' of the column areas (11 and 12) can be calculated. Since each column area (11 and 12) in the organic electroluminescent display panel is an area corresponding to at least one column of light emitting pixels, when the column areas (11 and 12) in the organic electroluminescent display panel are controlled to shift, they can only shift by taking the light emitting pixel as the minimum unit. Hence, when the calculation shift distance ΔS' is equal to an integral multiple of the width ΔX' of one column of light emitting pixels in the organic electroluminescent display panel, i.e., when the shift multiple m in $$m = \frac{\Delta S'}{\Delta X'}$$

is an integer, the column areas (11 and 12) in the organic electroluminescent display panel are controlled to shift for a distance of m light emitting pixels to the left along the row direction, i.e., shifting for ΔS'. However, when the shift multiple m is not an integer, the shift distance of the column areas (11 and 12) should be enabled to not only meet the integral multiple of the width of the light emitting pixel but also be closest to the calculated calculation shift distance ΔS'. Hence, the shift multiple m is firstly rounded off to obtain m', and then the column areas (11 and 12) in the organic electroluminescent display panel are controlled to shift for a distance of m' light emitting pixels to the left along the row direction.

In specific implementation, the human eye tracking unit in the human eye tracking control module can be arranged at a light exit side of the liquid crystal display panel. When the human eye tracking control module is configured to control the monocular pixel area of the liquid crystal display panel to shift along the row direction based on a shift distance of a target human eye to the left or to the right, the control unit can be integrated on a driving chip in the liquid crystal display panel. When the human eye tracking control module is configured to control the column area of the organic electroluminescent display panel to shift along the row direction based on a shift distance of a target human eye to the left or to the right, the control unit can be integrated on a driving chip in the organic electroluminescent display panel, which will not be defined here.

A display device provided by an embodiment of the present disclosure uses a black and white liquid crystal display panel, i.e., not arranging a color resistor layer formed by the color resistor material in the liquid crystal display panel, and arranging a light splitting film between the backlight panel and the liquid crystal layer. The light splitting film enables the light emitted from the backlight panel to be split into light of N colors, and the light of each color is projected onto a corresponding sub-pixel of the liquid crystal display panel. In this way, the light splitting film is used to replace the color resistor layer in the existing liquid crystal display device, and split the white light of the backlight panel into light of different colors so as to realize color display. Because light splitting efficiency of the light splitting film can be more than 30% generally, while light splitting efficiency of the color resistor layer is generally about 10%, hence, use of the light splitting film can reduce light loss of the display device and improve light transmissivity of the display device, thereby reducing power consumption of the display device.

Apparently, the skilled person in the art can make various modifications and variations to embodiments of the present disclosure without departing from the spirit and the scope of the present disclosure. In this way, provided that these modifications and variations to embodiments of the present disclosure fall within scopes of claims of the present disclosure and the equivalent technologies thereof, the present disclosure also intends to encompass these modifications and variations.

The invention claimed is:

1. A display device, comprising: a backlight panel emitting white light; a black and white liquid crystal display panel located at a light exit side of the backlight panel, wherein the liquid crystal display panel comprises a first substrate and a second substrate arranged opposite to each other and a liquid crystal layer located between the first substrate and the second substrate, and the liquid crystal display panel has a plurality of pixels arranged in matrix, each pixel comprises N sub-pixels arranged in a row direction, N being an integer greater than or equal to 3; and a light splitting film located between the liquid crystal layer and the backlight panel, wherein the light emitted from the backlight panel is split into light of N colors after passing through the light splitting film, and light of each color is projected onto a corresponding sub-pixel of the liquid crystal display panel, wherein the backlight panel is an organic electroluminescent display panel, wherein the organic electroluminescent display panel has a plurality of light emitting pixels arranged in matrix, and an area corresponding to at least one column of adjacent light emitting pixels is a column area, and wherein light emitting column areas and light shielding column areas in the organic electroluminescent display panel are arranged alternately, and when performing display, light emitting pixels in the light emitting column areas emit light, and light emitting pixels in the light shielding column areas do not emit light, wherein, in the liquid crystal display panel, an area corresponding to at least one column of pixels is a monocular pixel area, and left eye pixel areas and right eye pixel areas are arranged alternately, and wherein when performing 2D display, pixels corresponding to the left eye pixel areas and pixels corresponding to the adjacent right eye pixel areas display same image information, and, when performing 3D display, the pixels corresponding to the left eye pixel areas display left eye image information, and the pixels corresponding to the right eye pixel areas display right eye image information, and wherein the light emitted by the light emitting column areas in the organic electroluminescent display panel is projected towards a direction corresponding to a human left eye via the left eye pixel areas in the liquid crystal display panel, and projected towards a direction corresponding to a human right eye via the right eye pixel areas in the liquid crystal display panel, a human eye tracking control module, wherein the human eye tracking control module is configured to control the monocular pixel area of the liquid crystal display panel to shift along a row direction based on a shift distance of a target human eye to the left or to the right, or control the column area of the organic electroluminescent display panel to shift along the row direction, wherein the human eye tracking control module comprises: a human eye tracking unit, configured to determine a calculation shift distance $\Delta S$ of the monocular pixel area in the liquid crystal display panel based on the shift distance $\Delta P$ of the target human eye to the left or to the right according to $\Delta S/\Delta P=H/L$, wherein L is a distance between the target human eye and the organic electroluminescent display panel, H is a distance between the liquid crystal layer of the liquid crystal display panel and the organic electroluminescent display panel; and a control unit, configured to control the monocular pixel area of the liquid crystal display panel to shift for a distance of integer sub-pixels along a row direction consistent with the human eye moving direction based on the determined calculation shift distance $\Delta S$.

2. The display device as claimed in claim 1, wherein the control unit is further configured to: calculate a shift multiple m based on the determined calculation shift distance $\Delta S$ according to $m=\Delta S/\Delta X$, wherein $\Delta X$ is a width of one column of sub-pixels in the liquid crystal display panel; control the monocular pixel area of the liquid crystal display panel to shift for a distance of m sub-pixels along the row direction if the shift multiple m is an integer; round off the shift multiple m to obtain m' if the shift multiple m is not an integer, and control the monocular pixel area of the liquid crystal display panel to shift for a distance of m' sub-pixels along the row direction.

3. A display device, comprising: a backlight panel emitting white light;
a black and white liquid crystal display panel located at a light exit side of the backlight panel, wherein the liquid crystal display panel comprises a first substrate and a second substrate arranged opposite to each other and a liquid crystal layer located between the first substrate and the second substrate, and the liquid crystal display panel has a plurality of pixels arranged in matrix, each pixel comprises N sub-pixels arranged in a row direction, N being an integer greater than or equal to 3; and a light splitting film located between the liquid crystal layer and the backlight panel, wherein the light emitted from the backlight panel is split into light of N colors after passing through the light splitting film, and light of each color is projected onto a corresponding sub-pixel of the liquid crystal display panel, wherein the backlight panel is an organic electroluminescent display panel, wherein the organic electroluminescent display panel has a plurality of light emitting pixels arranged in matrix, and an area corresponding to at least one column of adjacent light emitting pixels is a column area, and wherein light emitting column areas and light shielding column areas in the organic electroluminescent display panel are arranged alternately, and when performing display, light emitting pixels in the light emitting column areas emit light, and light emitting pixels in the light shielding column areas do not emit light, wherein, in the liquid crystal display panel, an area corresponding to at least one column of pixels is a monocular pixel area, and left eye pixel areas and right eye pixel areas are arranged alternately, and wherein when performing 2D display, pixels corresponding to the left eye pixel areas and pixels corresponding to the adjacent right eye pixel areas display same image information, and, when performing 3D display, the pixels corresponding to the left eye pixel areas display left eye image information, and the pixels corresponding to the right eye pixel areas display right eye image information, and wherein the light emitted by the light emitting column areas in the organic electroluminescent display panel is projected towards a direction corresponding to a human left eye via the left eye pixel areas in the liquid crystal display panel, and projected towards a direction corresponding to a human right eye via the right eye pixel areas in the liquid crystal display panel, a human eye tracking control module, wherein the human eye tracking control module is configured to control the monocular pixel area of the liquid crystal display panel to shift along a row direction based on a shift distance of a target human eye to the left or to the right, or control the column area of the organic electroluminescent display panel to shift along the row direction, wherein the human eye tracking control module comprises: a human eye tracking unit, configured to determine a calculation shift distance $\Delta S'$ of the column area in the organic electroluminescent display panel based on the shift distance $\Delta P$ of the target human eye to the left or to the right according to $\Delta S'/\Delta P=H/L$-H, wherein L is a distance between the target human eye and the organic electroluminescent display panel, H is a distance between the liquid crystal layer of the liquid crystal display panel and the organic electroluminescent display panel; and a control unit, configured to control the column area of the organic electroluminescent display panel to shift for a distance of integer light emitting pixels along a row direction opposite to the human eye moving direction based on the determined calculation shift distance $\Delta S'$.

4. The display device as claimed in claim 3, wherein the control unit is further configured to:
calculate a shift multiple m based on the determined calculation shift distance $\Delta S'$ $$m = \frac{\Delta S'}{\Delta X'},$$

according to wherein $\Delta X'$ is a width of one column of light emitting pixels in the organic electroluminescent display panel;
control the column area of the organic electroluminescent display panel to shift for a distance of m light emitting pixels along the row direction if the shift multiple m is an integer;
round off the shift multiple m to obtain m' if the shift multiple m is not an integer, and control the column area of the organic electroluminescent display panel to shift for a distance of m' light emitting pixels along the row direction.

5. The display device as claimed in claim 1, wherein the light splitting film is located at a side of the backlight panel facing towards the liquid crystal display panel.

6. The display device as claimed in claim 1, wherein the first substrate is closer to the backlight panel than the second substrate, and the light splitting film is located at a side of the first substrate facing towards the liquid crystal layer.

7. The display device as claimed in claim 1, wherein the first substrate is closer to the backlight panel than the second substrate, and the light splitting film is located at a side of the first substrate facing towards the backlight panel.

8. The display device as claimed in claim 1, wherein the first substrate is closer to the backlight panel than the second substrate, and a polarizer is further arranged at a side of the first substrate facing away from the liquid crystal layer, and wherein the light splitting film is located at a side of the polarizer facing towards the backlight panel, or the light splitting film is located between the first substrate and the polarizer.

9. The display device as claimed in claim 1, wherein the light splitting film is located at a side of the backlight panel facing towards the liquid crystal display panel.

10. The display device as claimed in claim 1, wherein the first substrate is closer to the backlight panel than the second substrate, and the light splitting film is located at a side of the first substrate facing towards the liquid crystal layer.

11. The display device as claimed in claim 1, wherein the first substrate is closer to the backlight panel than the second substrate, and the light splitting film is located at a side of the first substrate facing towards the backlight panel.

12. The display device as claimed in claim 1, wherein the first substrate is closer to the backlight panel than the second substrate, and a polarizer is further arranged at a side of the first substrate facing away from the liquid crystal layer, and wherein the light splitting film is located at a side of the polarizer facing towards the backlight panel, or the light splitting film is located between the first substrate and the polarizer.

13. The display device as claimed in claim 1, wherein the light splitting film is located at a side of the backlight panel facing towards the liquid crystal display panel.

14. The display device as claimed in claim 1, wherein the first substrate is closer to the backlight panel than the second substrate, and the light splitting film is located at a side of the first substrate facing towards the liquid crystal layer.

15. The display device as claimed in claim 1, wherein the first substrate is closer to the backlight panel than the second substrate, and the light splitting film is located at a side of the first substrate facing towards the backlight panel.

16. The display device as claimed in claim 1, wherein the first substrate is closer to the backlight panel than the second substrate, and a polarizer is further arranged at a side of the first substrate facing away from the liquid crystal layer, and wherein the light splitting film is located at a side of the polarizer facing towards the backlight panel, or the light splitting film is located between the first substrate and the polarizer.

17. The display device as claimed in claim 1, wherein the light splitting film is located at a side of the backlight panel facing towards the liquid crystal display panel.

* * * * *